United States Patent
MacLean et al.

(10) Patent No.: US 8,040,181 B2
(45) Date of Patent: Oct. 18, 2011

(54) TIME DELAY COMPENSATION AND PULSE WIDTH CORRECTION

(75) Inventors: William David MacLean, Austin, TX (US); Bruce Carl Larson, Austin, TX (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 12/495,671

(22) Filed: Jun. 30, 2009

(65) Prior Publication Data

US 2010/0327972 A1    Dec. 30, 2010

(51) Int. Cl.
    *H03F 3/38* (2006.01)
(52) U.S. Cl. ......................................................... 330/10
(58) Field of Classification Search .................... 330/10, 330/136, 280
    See application file for complete search history.

(56) References Cited

U.S. PATENT DOCUMENTS

2006/0091945 A1 * 5/2006 Wegner ........................... 330/10

* cited by examiner

*Primary Examiner* — Steven J Mottola
(74) *Attorney, Agent, or Firm* — TIPS Group

(57) ABSTRACT

A system, method and apparatus is provided for pulse width correction in a power driver. In an embodiment, an apparatus includes an operational amplifier having an input and an output. The input of the operational amplifier is coupled to receive an input pulse signal. The apparatus further includes an output stage having an input coupled to the output of the operational amplifier. The output stage also includes a current output configured to couple to a load and to a voltage sense output. The apparatus also includes a comparator having an inverting input coupled to the voltage sense output of the output stage, a non-inverting input configured to couple to an input signal, and an output. Also, the apparatus includes a timing circuit with an input coupled to the output of the comparator and an input coupled to the input signal. The timing circuit also has an output to supply the input pulse signal. The timing circuit measures a delay from a change in the input signal to a change in the output of the comparator. The timing circuit replicates the measured delay as a delay in a change to the input pulse signal.

19 Claims, 6 Drawing Sheets

TIME DELAY COMPENSATION AND PULSE WIDTH CORRECTION

BACKGROUND

When operating a dimmer or other pulse-width-dependent circuit, replicating the pulse width can become important. If a pulse width at an input varies significantly from the corresponding output pulse width, this can cause significant problems. For example, a pulse may not achieve an output signal, as slew rate limits may stop the output stage from turning on. Likewise, an intended effect of a certain pulse width may be limited or missed completely, due to changes in pulse width to provide an output.

Many applications use a pulsed power waveform to provide power to a component. For example, light emitting diodes (LEDs) can be driven with a pulsed waveform. Likewise, sound equipment such as sub-woofers may be driven with a pulsed waveform to provide power. Moreover, dimmer switches are often implemented with a pulse waveform as a power output to the component to be dimmed or controlled.

Thus, it may be useful to find a way to make the pulse-width of the output of a circuit close to identical to the input. In particular, it may be useful to measure an input pulse width, to allow for calculation of a delay to a pulse width output (e.g. a rising edge of an output pulse) or to measure a delay to the end of the input pulse (e.g. a falling edge of the input pulse). In such an instance, dynamic range may be improved, and a situation where the output never turns on may be avoided.

SUMMARY

The present invention is illustrated and described by way of example in the following text and drawings. The text and drawings should be understood as illustrative rather than limiting.

In an embodiment, an apparatus is provided. In an embodiment, the apparatus includes an operational amplifier having an input and an output. The input of the operational amplifier is coupled to receive an input pulse signal. The apparatus further includes an output stage having an input coupled to the output of the operational amplifier. The output stage also includes a current output configured to couple to a load and to a voltage sense output. The apparatus also includes a comparator having an inverting input coupled to the voltage sense output of the output stage, a non-inverting input configured to couple to an input signal, and an output. Also, the apparatus includes a timing circuit with an input coupled to the output of the comparator and an input coupled to the input signal. The timing circuit also has an output to supply the input pulse signal. The timing circuit measures a delay from a change in the input signal to a change in the output of the comparator. The timing circuit replicates the measured delay as a delay in a change to the input pulse signal.

In another embodiment, a method is provided. The method includes receiving a pulse leading edge as an input signal. The method also includes asserting an output signal responsive to the pulse leading edge. The method further includes measuring a delay from receipt of the pulse leading edge to assertion of the output signal. Additionally, the method includes receiving a pulse trailing edge as an input signal. Moreover the method includes delaying de-assertion of the output signal for a time approximately equal to the measured delay. The method also includes de-asserting the output signal.

In yet another embodiment, an apparatus, is provided. The apparatus includes an operational amplifier with an input and an output. The input is coupled to receive an input pulse signal. The apparatus includes an output stage with an input coupled to the output of the operational amplifier. The output stage has a current output configured to couple to a load and to provide a voltage sense output. The apparatus also includes a comparator with an inverting input coupled to the voltage sense output of the output stage, a non-inverting input coupled to the input pulse signal, and an output. The apparatus further includes a timing circuit with an input coupled to the output of the comparator and an input configured to couple to an input signal. The timing circuit has an output to supply the input pulse signal. The timing circuit is to measure a property of the input signal. The timing circuit is also to replicate the measured property as a property of the input pulse signal.

BRIEF DESCRIPTION OF THE DRAWINGS

The present invention is illustrated by way of example in the accompanying drawings. The drawings should be understood as illustrative rather than limiting.

Figure 1:
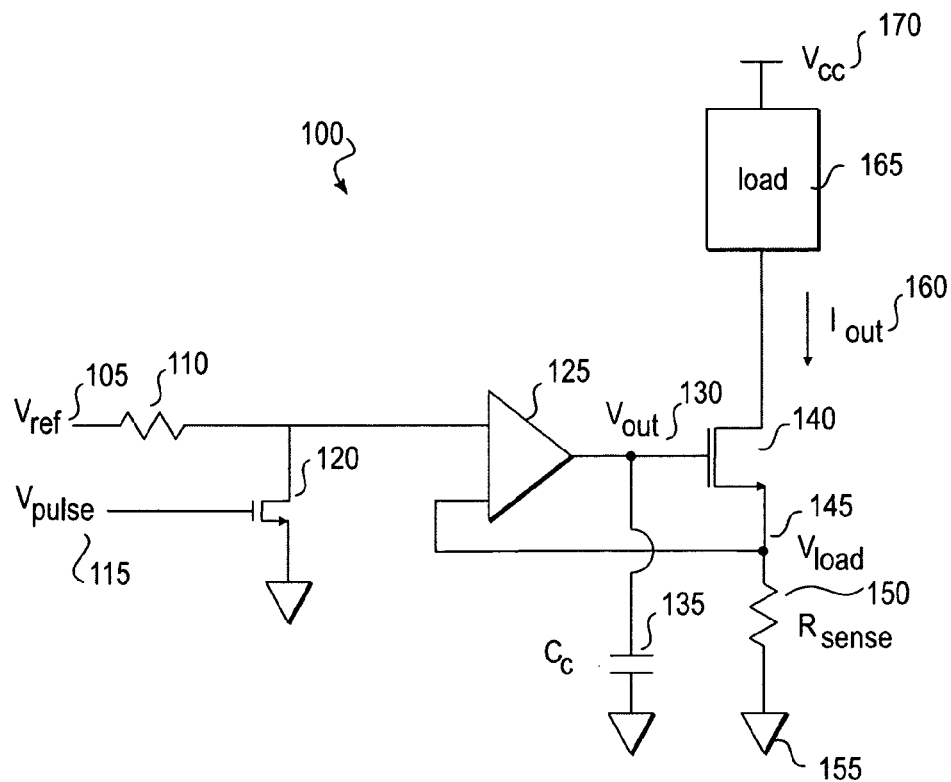
FIG. 1 illustrates an embodiment of a power driver circuit using an input pulse.

The drawings should be understood as illustrative rather than limiting.

DETAILED DESCRIPTION

A system, method and apparatus is provided for pulse width correction in a power driver. Pulse width correction in a power driver can provide for better output performance and greater dynamic range in such a driver circuit. Such power driver circuits may be used in a wide variety of applications where use of a power signal in a pulsed waveform is useful.

In an embodiment, an apparatus is provided. In an embodiment, the apparatus includes an operational amplifier having an input and an output. The input of the operational amplifier is coupled to receive an input pulse signal. The apparatus further includes an output stage having an input coupled to the output of the operational amplifier. The output stage also includes a current output configured to couple to a load and to a voltage sense output. The apparatus also includes a comparator having an inverting input coupled to the voltage sense output of the output stage, a non-inverting input configured to couple to an input signal, and an output. Also, the apparatus includes a timing circuit with an input coupled to the output of the comparator and an input coupled to the input signal. The timing circuit also has an output to supply the input pulse signal. The timing circuit measures a delay from a change in the input signal to a change in the output of the comparator. The timing circuit replicates the measured delay as a delay in a change to the input pulse signal.

In some embodiments, the apparatus may further include a voltage offset interposed between the voltage sense output of the output stage and the inverting input of the comparator. Likewise, in some embodiments the apparatus may use a power MOSFET as the output stage with a gate coupled to the output of the operational amplifier, a first terminal configured to couple to a load and a second terminal configured to couple to ground. Moreover, in some embodiments, the timing circuit is implemented with an RC circuit, whereas in other embodiments the timing circuit is implemented as a counter. Also, in some embodiments, the operational amplifier is a transconductance amplifier.

In another embodiment, a method is provided. The method includes receiving a pulse leading edge as an input signal. The method also includes asserting an output signal responsive to the pulse leading edge. The method further includes measuring a delay from receipt of the pulse leading edge to assertion of the output signal. Additionally, the method includes receiving a pulse trailing edge as an input signal. Moreover the method includes delaying de-assertion of the output signal for a time approximately equal to the measured delay. The method also includes de-asserting the output signal.

In yet another embodiment, an apparatus, is provided. The apparatus includes an operational amplifier with an input and an output. The input is coupled to receive an input pulse signal. The apparatus includes an output stage with an input coupled to the output of the operational amplifier. The output stage has a current output configured to couple to a load and to provide a voltage sense output. The apparatus also includes a comparator with an inverting input coupled to the voltage sense output of the output stage, a non-inverting input coupled to the input pulse signal, and an output. The apparatus further includes a timing circuit with an input coupled to the output of the comparator and an input configured to couple to an input signal. The timing circuit has an output to supply the input pulse signal. The timing circuit is to measure a property of the input signal. The timing circuit is also to replicate the measured property as a property of the input pulse signal.

The specific embodiments described in this document represent example embodiments of the present invention, and are illustrative in nature rather than restrictive. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Features and aspects of various embodiments may be integrated into other embodiments, and embodiments illustrated in this document may be implemented without all of the features or aspects illustrated or described.

Embodiments may solve many of the problems identified above and provide a system and components that meet many, if not all, of the identified needs. Further, the system may present all of these components in a single unified platform, or as a set of separate components. In an embodiment, several major components are used. These components include an input terminal, an amplifier, a timer, and an output power transistor.

Figure 2:
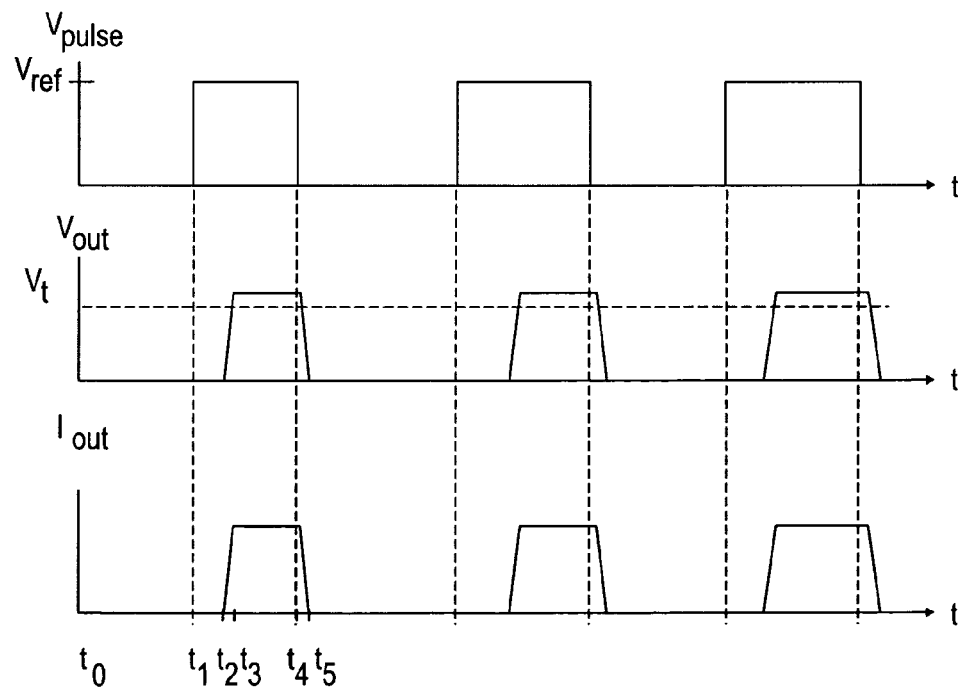
FIG. 2 illustrates waveforms potentially associated with the circuit of FIG. 1.

FIG. 1 illustrates an embodiment of a power driver circuit. A conventional power driver circuit 100 may be used to drive a load 165, such as a collection of LEDs (light emitting diodes) or another source, for example. Such a load 165 may be driven using an input signal sure as that provided in FIG. 2 (Vpulse). In particular, FIG. 2 illustrates waveforms potentially associated with the circuit of FIG. 1. Pulses are received as an input signal at Vpulse 115, which controls a gate terminal of MOSFET 120. FET 120 is coupled at one terminal (e.g. a drain terminal) to ground 155 and at another terminal to a non-inverting input of operational amplifier 125. Also coupled to the non-inverting input of operational amplifier 125 is a Vref signal 105 coupled through a resistor 110. Thus, the non-inverting input of operational amplifier 125 tends to stay at roughly Vref 105 except when Vpulse 115 causes FET 120 to pull the non-inverting input of operational amplifier 125 close to ground (0V).

Operational amplifier 125 provides an output at a node Vout 130, which is coupled to a capacitor 135 (and thereby to ground 155), and which drives a gate terminal of MOSFET 140. FET 140 provides a power FET which is coupled at one terminal (e.g. a source terminal) to load 165, and thereby to Vcc 170 (a power supply rail). FET 140 is also coupled at one terminal (e.g. a drain terminal) to Vload node 145. Vload 145 is also coupled to Rsense 150 which is coupled in turn to ground 155. Vload 145 is also coupled to the inverting input of operational amplifier 125. Thus, in operation, amplifier 125 tends to keep Vload 145 at the same value as the non-inverting input of amplifier 125, and thereby provides a pulsed driving current Iout 160 to load 165.

Pulses at Vpulse 115 as shown in FIG. 2 are replicated as pulses at Vout 130 (also shown in FIG. 2), and thus provide an Iout current 160 (further shown in FIG. 2). If Vpulse 115 is pulsed at 100 Hz or more, an LED will flicker at a rate high enough that the human eye will tend to see it as a steady light, with the duty cycle of Vpulse tending to regulate the brightness of such an LED. However, as is apparent qualitatively from inspection of FIG. 2, the pulses at Vout 130 and the resulting Iout 160 tend to be slew-rate limited, reducing the duty cycle of the output of the circuit 100 and limiting the dynamic range of the output. Thus, t1 represents a leading edge of a pulse of Vpulse, t2 represents a leading edge of output current Iout, t3 represents the regulated current Iout (essentially the full current output as regulated by an operational amplifier), t4 represents the trailing or falling edge of both Vpulse and Iout, and t5 represents shutoff of Iout. The difference between t1 and t4 is greater than the difference between t2 and t4, indicating that the duty cycle at Vpulse is greater than the corresponding duty cycle of Iout (and Vout) for this circuit 100.

Figure 3:
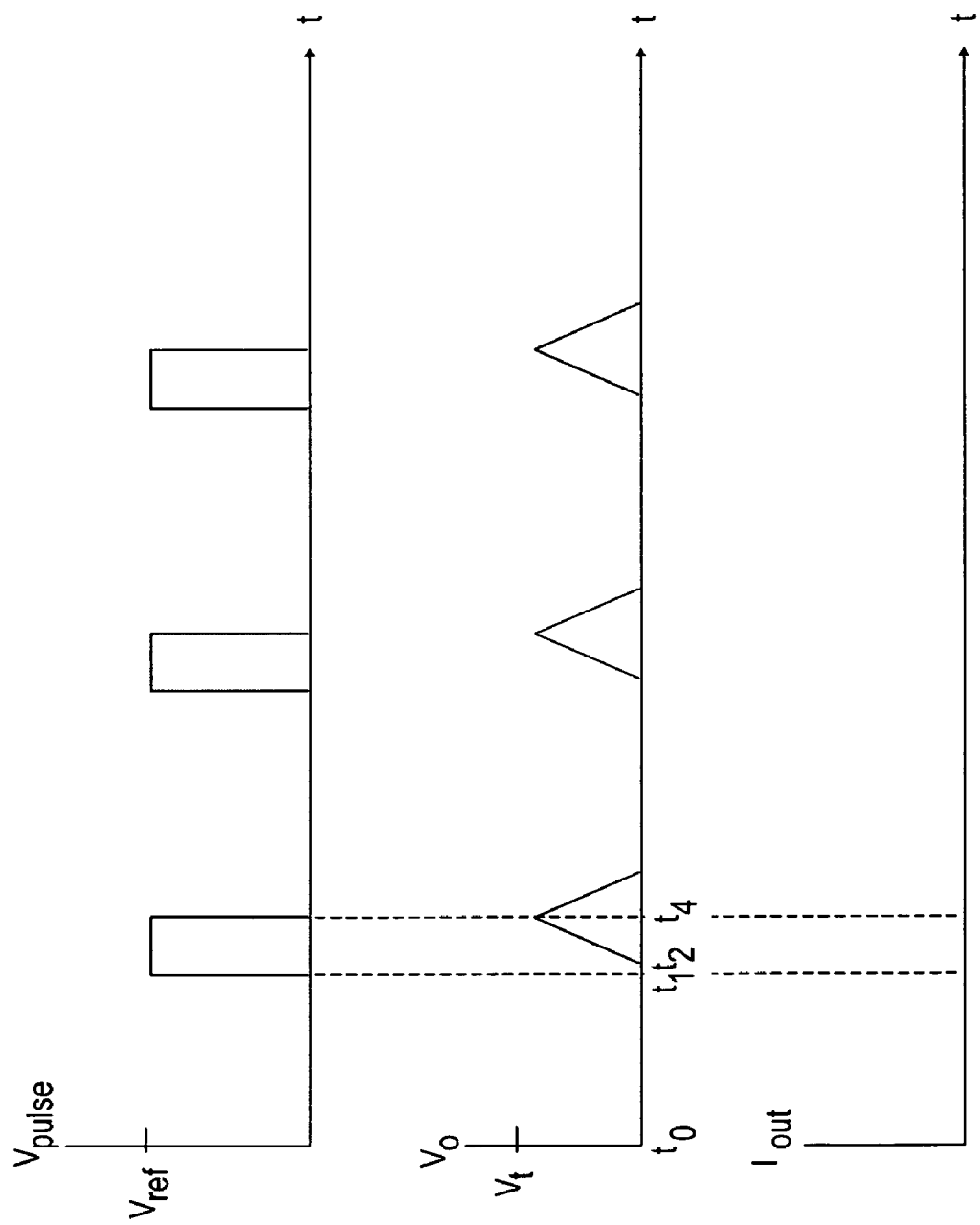
FIG. 3 illustrates additional waveforms potentially associated with the circuit of FIG. 1.

A more extreme or degenerate case is illustrated in FIG. 3. FIG. 3 illustrates additional waveforms potentially associated with the circuit of FIG. 1. In FIG. 3, the duty cycle of Vpulse is small, such as 10% or 20%. The output voltage Vout (shown as Vo) is truncated by the slew rate limit. This slew rate limit may be a result of excess capacitance at FET 140, or a limit to the current available to amplifier 125, for example. For a power FET such as FET 140, the threshold voltage Vt may be 5V. If Vpulse is set to drive 5V, but Vout is limited by slew rate factors to reaching a peak of less than 5V, then Iout may never turn on. Thus, the time from t1 to t4 may seem like enough to cause the FET 140 to turn on, but the slew rate and delay in raising Vout at t2 may be such that Vout never reaches Vt, and Iout stays at essentially 0. Note that the decay or decrease in the voltage Vout tends to propagate from the Vpulse signal faster than the increase in voltage Vout. This is due to the fact that Vout starts well below Vt, but ends up not much above Vt, meaning that the FET 140 in FIG. 1 is biased to be driven with a small overdrive relative to Vt. E.g., Vt may be 5V, and the overdrive may be 50 mV or 250 mV, meaning that Vout need only drop by the small overdrive to start turning off FET 140. With a small enough pulse, FET 140 simply never turns on. Thus, it may be useful to provide a power driver circuit which increases the pulse width of the output pulse corresponding to a given input pulse.

Figure 4:
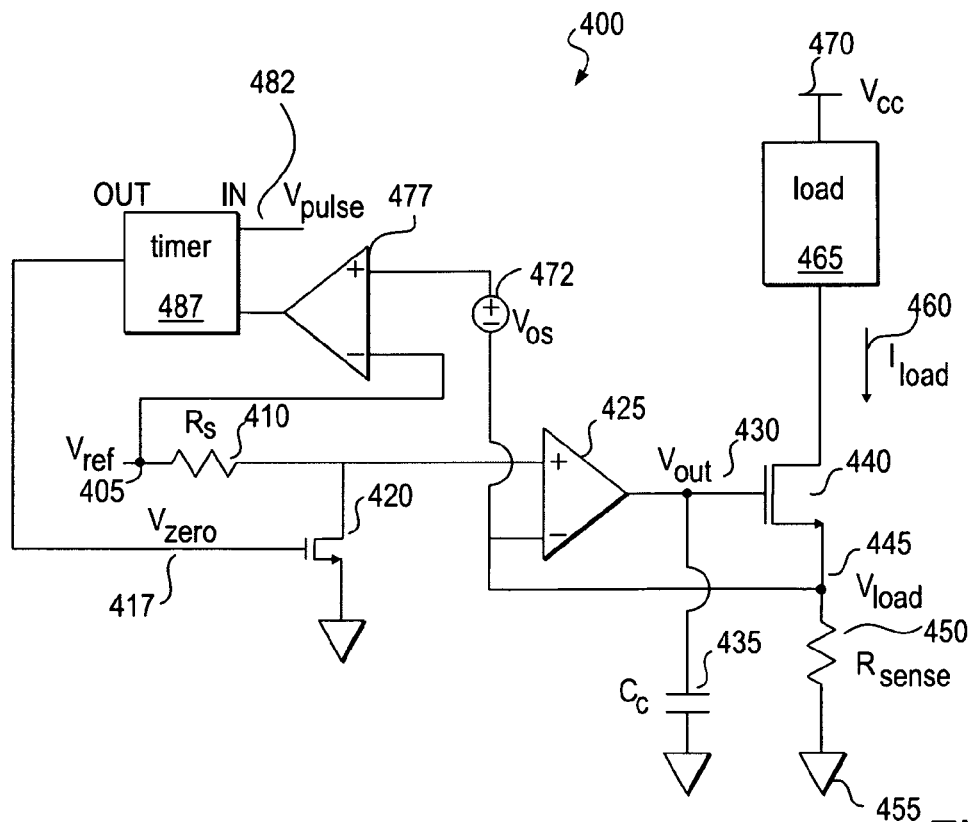
FIG. 4 illustrates an embodiment of another power driver circuit using an input pulse.

Turning now to FIG. 4, an example of an embodiment that may improve the pulse width situation is provided. FIG. 4 illustrates an embodiment of another power driver circuit. As with FIG. 1, circuit 400 provides a power driver circuit. Pulses are received as an input signal at Vpulse 486, which provides an input to timing circuit 487. Timing circuit 487 generates a Vzero signal 417 as an output which controls a gate terminal of MOSFET 420. FET 420 is coupled at one terminal (e.g. a drain terminal) to ground 455 and at another terminal to a non-inverting input of operational amplifier 425. Also coupled to the non-inverting input of operational amplifier 425 is a Vref signal 405 coupled through a resistor 410. Thus, the non-inverting input of operational amplifier 425 tends to stay at roughly Vref 405 except when Vzero 417 causes FET 420 to pull the non-inverting input of operational amplifier 425 close to ground (0V).

Operational amplifier 425 provides an output at a node Vout 430, which is coupled to a capacitor 435 (and thereby to ground 455), and which drives a gate terminal of MOSFET 440. FET 440 provides a power FET which is coupled at one terminal (e.g. a source terminal) to load 465, and thereby to Vcc 470 (a power supply rail). FET 440 is also coupled at one terminal (e.g. a drain terminal) to Vload node 445. Vload 445 is also coupled to Rsense 450 which is coupled in turn to ground 455. Vload 445 is also coupled to the inverting input of operational amplifier 425. Vload 445 is also coupled to an input of operational amplifier 477 through voltage offset source 472. Vref 405 is likewise coupled to an input of amplifier 477. In this circuit, amplifier 477 functions as a comparator, determining when Vload 445 is greater than Vef 405, and providing an output indicating such to timing circuit 487. Timing circuit 487 may thus receiving a rising edge of Vpulse 487 and raise or assert Vzero 417. When Vpulse 487 falls, timing circuit may determine that Vload 445 is lower than Vref 405 for a measured amount of time, and thus extend the pulse width of Vzero 417 by a similar time before de-asserting Vzero 417 responsive to the fall of Vpulse 487. In operation, amplifier 425 tends to keep Vload 445 at the same value as the non-inverting input of amplifier 425, and thereby provides a pulsed driving current Iout 460 to load 465. With the output pulse roughly equivalent in duration to the input pulse, this will tend to allow for smaller pulses as input signals, and a greater dynamic range.

Figure 5:
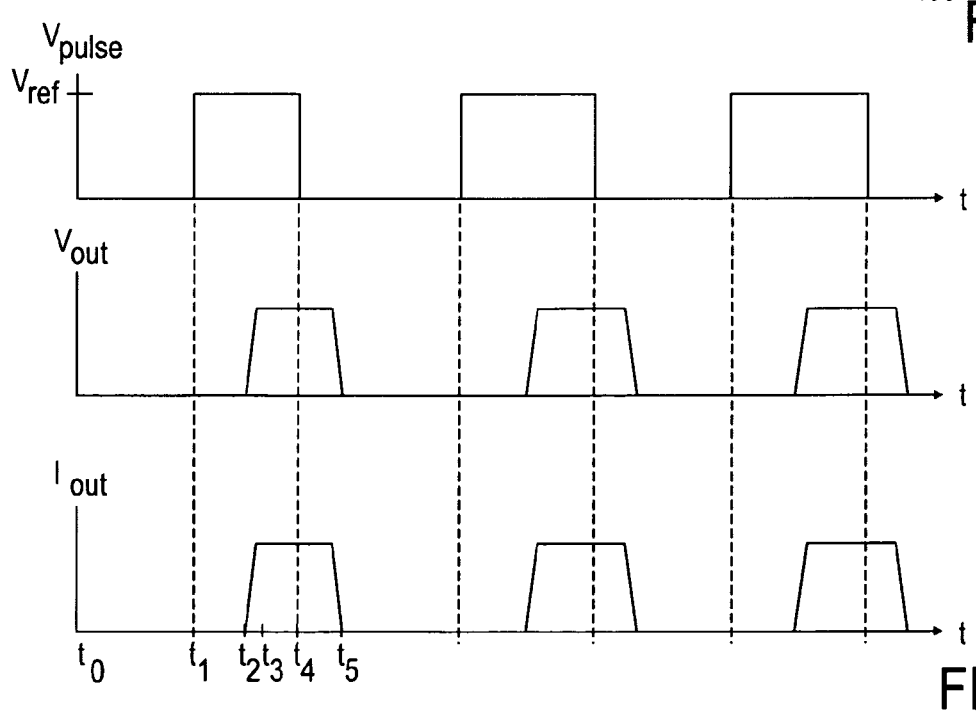
FIG. 5 illustrates waveforms potentially associated with the circuit of FIG. 4.

Turning to associated waveforms, FIG. 5 illustrates waveforms potentially associated with the circuit of FIG. 4. Vpulse is provided with a duty cycle. Vout has a similar duty cycle, and the corresponding waveform of Iout thus has a similar duty cycle. At t1, a rising edge of an input pulse is seen. At t2, Iout begins to rise. At t3, Iout comes into regulation. At t4, a falling edge of the input pulse is seen. At t5, the current Iout begins to fall. With the timing circuit, the time from t1 to t2 is approximately the same as the time from t4 to t5.

Figure 6:
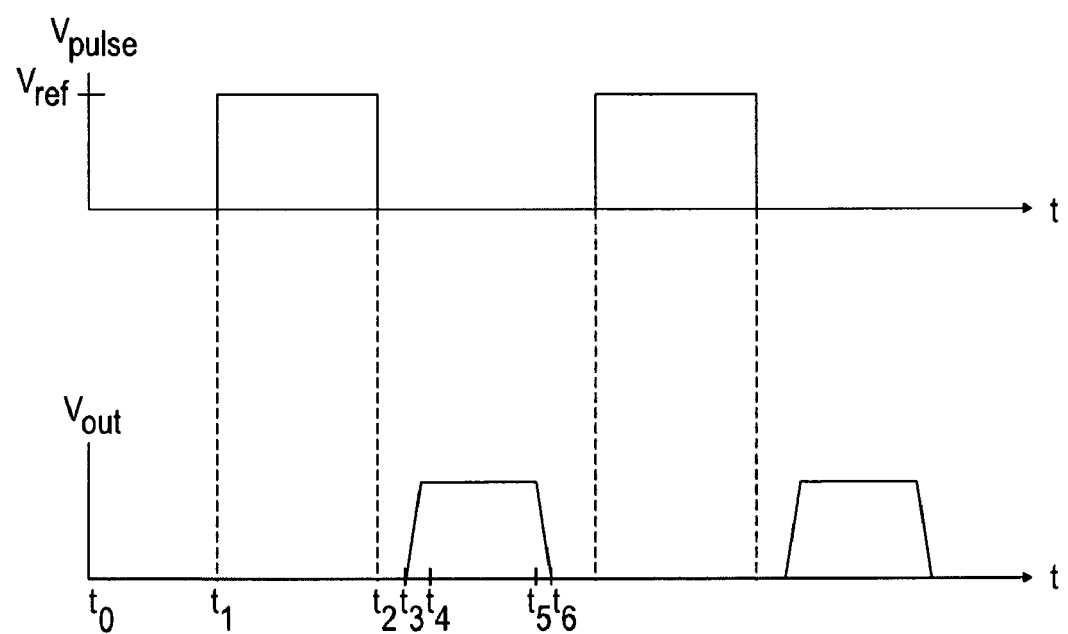
FIG. 6 illustrates other waveforms potentially associated with the circuit of FIG. 4.

Another option for the timing circuit 487 is to provide a delay for the entire pulse instead of a delay from rising edge to rising edge. FIG. 6 illustrates other waveforms potentially associated with the circuit of FIG. 4, related to this option. As illustrated, the time from t1 (rising edge of input) to t2 (falling edge of input) is roughly equivalent to the time from t3 (rising edge of output) to t5 (falling edge of output). The timing circuit 487 counts the time from t1 to t2, and asserts Vzero for a similar amount of time, from t3 to t5. Note that timing circuit 487 may be implemented in a variety of ways, such as through use of a fast digital counter or through use of an RC timing circuit, for example. Also, note that operational amplifiers 125 and 425 may be transconductance amplifiers, or may be other operational amplifiers if other considerations warrant it. For example, a single-ended input may be useful.

Figures 7, 8:
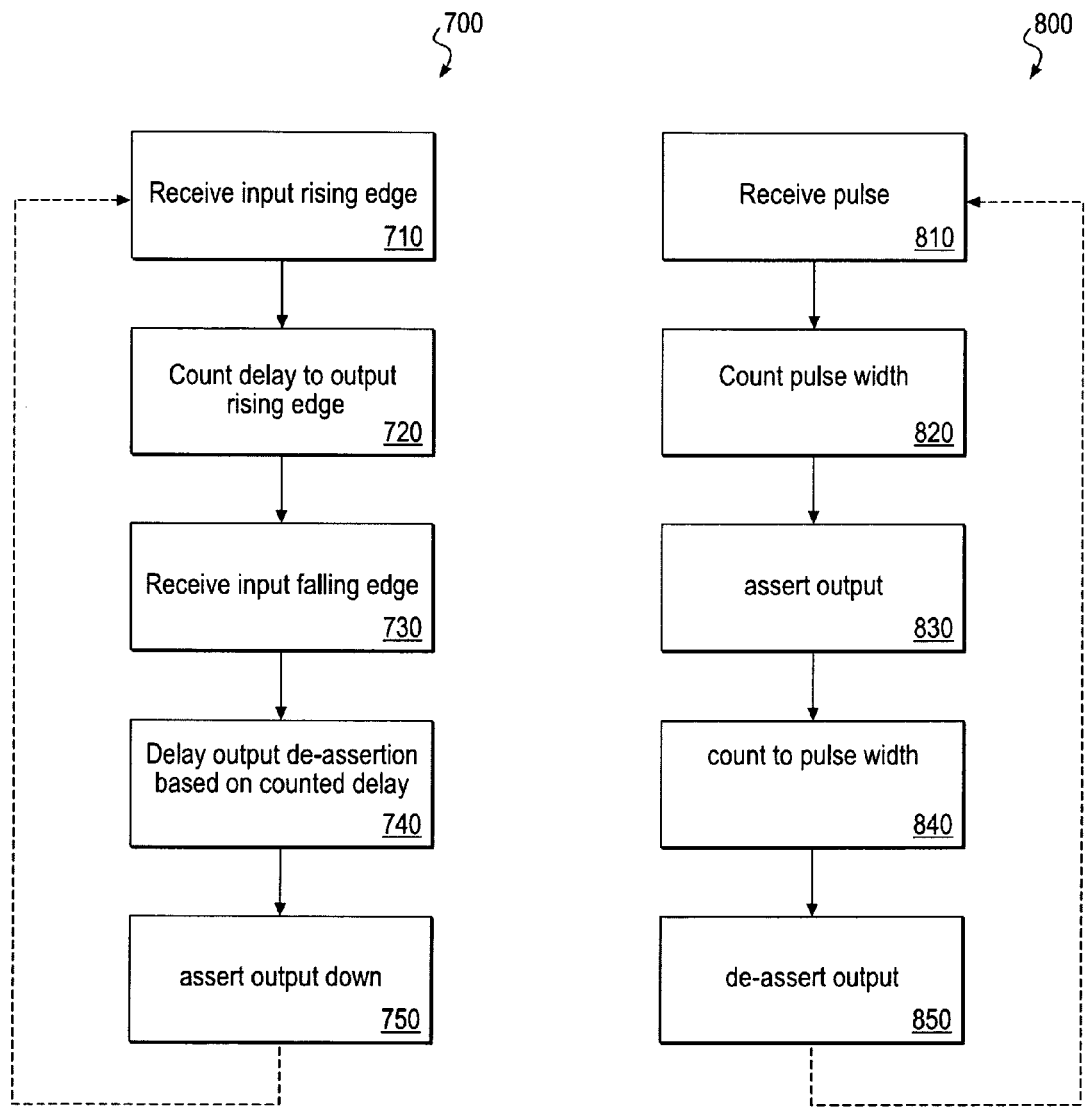
FIG. 7 illustrates an embodiment of a process of operating a power driver circuit with pulse width correction.
FIG. 8 illustrates an alternate embodiment of a process of operating a power driver circuit with pulse width correction.

The processes implemented by the two examples may provide further insight into the circuit. FIG. 7 illustrates an embodiment of a process of operating a power driver circuit with pulse width correction. Process 700 includes receiving a rising edge, counting delay to an output rising edge, receiving a falling edge, delaying output de-assertion based on a counted delay, and de-asserting the output signal. Process 700 and other processes of this document are implemented as a set of modules, which may be process modules or operations, hardware modules designed to fulfill the process operations, or some combination of the various types of modules, for example. Process 700 initiates with receipt of an input rising edge at module 710. At module 720, a delay from the input rising edge to an output rising edge is measured or counted. At module 730, a falling edge of an input is received. Responsive to the falling edge of module 730 and the delay measured at module 720, a similar delay time is counted at module 740. At module 750, the output signal (e.g. the signal driving a gate of a power MOSFET) is de-asserted, providing a pulse width similar to that of the input signal.

Should one wish to implement a delay for the entire pulse width, rather than a delay in de-assertion, FIG. 8 provides some insights. FIG. 8 illustrates an alternate embodiment of a process of operating a power driver circuit with pulse width correction. Process 800 includes receiving an input rising edge, counting a pulse width, asserting an output (after the pulse completes), counting to the pulse width, and de-asserting the output. Thus, process 800 provides a process that measures an entire pulse, and then provides a similar output pulse.

Process 800 initiates with receipt of a pulse rising edge at module 810. At module 820, the pulse width is counted or measured until a falling edge is seen. At module 820, responsive to the filling edge, an output is asserted. The time after the assertion of the output is measured at module 840, which counts the time of assertion up to the pulse width. At module 850, responsive to reaching the pulse width limit, the output is de-asserted.

Figure 9:
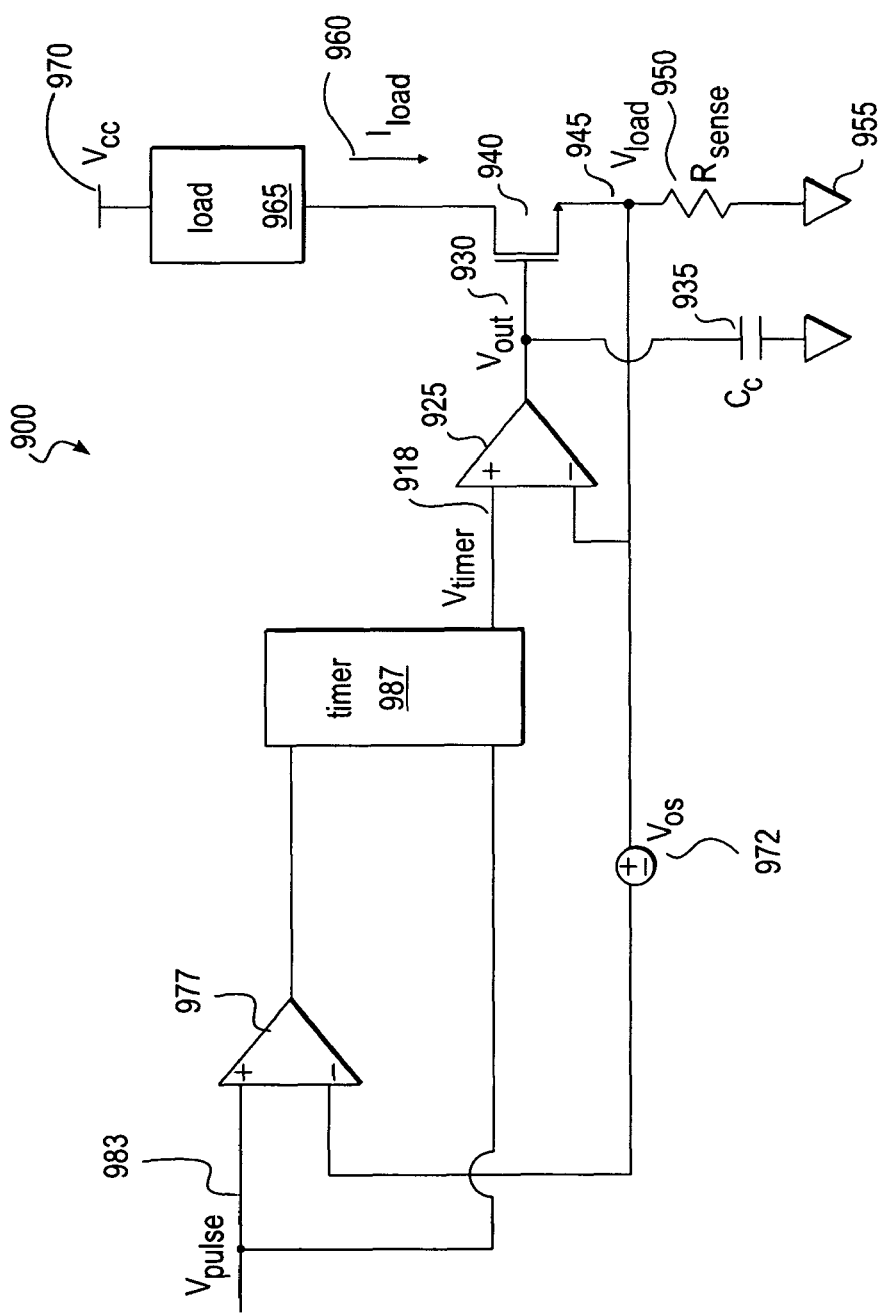
FIG. 9 illustrates an alternate embodiment of a power driver circuit using an input pulse.

FIG. 9 illustrates an alternate embodiment of a power driver circuit. While driver circuit 400 provides an embodiment, driver circuit 900 may also be used. Pulses are received as an input signal at Vpulse 983, which provides an input to comparator 977. Comparator 977 provides an output which is coupled as an input to timing circuit 987. Timing circuit 987 generates a Vtimer signal 918 as an output which provides an input to operational amplifier 925.

Operational amplifier 925 provides an output at a node Vout 930, which is coupled to a capacitor 935 (and thereby to ground 955), and which drives a gate terminal of MOSFET 940. FET 940 provides a power FET which is coupled at one terminal (e.g. a source terminal) to load 965, and thereby to Vcc 970 (a power supply rail). FET 940 is also coupled at one terminal (e.g. a drain terminal) to Vload node 945. Vload 945 is also coupled to Rsense 950 which is coupled in turn to ground 955. Vload 945 is also coupled to the inverting input of operational amplifier 925. Vload 945 is also coupled to an input of operational amplifier 977 through voltage offset source 972. In this circuit, amplifier 977 functions as a comparator, determining when Vload 945 is greater than Vpulse 983, and providing an output indicating such to timing circuit 987. Timing circuit 987 may thus receiving a rising edge of Vpulse 983 and raise or assert Vtimer 918. When Vpulse 983 falls, timing circuit may determine that Vload 945 is lower than Vpulse 983 for a measured amount of time, and thus extend the pulse width of Vtimer 918 by a similar time before de-asserting Vtimer 918 responsive to the fall of Vpulse 983. In operation, amplifier 925 tends to keep Vload 945 at the same value as the non-inverting input of amplifier 925, and thereby provides a pulsed driving current Iout 960 to load 965. With the output pulse roughly equivalent in duration to the input pulse, this will tend to allow for smaller pulses as input signals, and a greater dynamic range. Note that load 965 may be any type of load which operates on a model where the power supply may be supplied as a series of pulses. Examples include audio equipment (e.g. a sub-woofer) and dimmer switched devices (with the circuit substituting as part of the dimmer switch). LEDs have also been mentioned as potential loads, and other loads capable of handling a pulse width as an input may be used as well.

One skilled in the art will appreciate that although specific examples and embodiments of the system and methods have been described for purposes of illustration, various modifications can be made without deviating from the present invention. For example, embodiments of the present invention may be applied to many different types of applications, such as vehicles, personal use, stationary use, temporary or permanent installations, or other environments. Moreover, features of one embodiment may be incorporated into other embodiments, even where those features are not described together in a single embodiment within the present document.

The invention claimed is:

1. An apparatus, comprising:
an operational amplifier having an input and an output, the input coupled to receive an input pulse signal;
an output stage having an input coupled to the output of the operational amplifier, a current output configured to couple to a load and a voltage sense output;
a comparator having a non-inverting input coupled to the voltage sense output of the output stage, an inverting input configured to couple to an input signal and an output; and
a timing circuit having an input coupled to the output of the comparator and an input coupled to the input signal and having an output to supply the input pulse signal, the timing circuit to measure a delay from a change in the input signal to a change in the output of the comparator, the timing circuit to replicate the measured delay as a delay in a change to the input pulse signal.

2. The apparatus of claim 1, further comprising:
a voltage offset interposed between the voltage sense output of the output stage and the inverting input of the comparator.

3. The apparatus of claim 1, wherein:
the output stage is a power MOSFET having a gate coupled to the output of the operational amplifier, a first terminal configured to couple to a load and a second terminal configured to couple to ground.

4. The apparatus of claim 1, wherein:
the timing circuit is implemented with an RC circuit.

5. The apparatus of claim 1, wherein:
the timing circuit is implemented with a digital counter.

6. The apparatus of claim 1, wherein:
the operational amplifier is a transconductance amplifier.

7. The apparatus of claim 1, wherein:
an LED is coupled to the output stage as the load.

8. The apparatus of claim 1, wherein:
an audio component is coupled to the output stage as the load.

9. The apparatus of claim 1, wherein:
a dimmable light is coupled to the output stage as the load.

10. The apparatus of claim 1, further comprising:
a voltage offset interposed between the voltage sense output of the output stage and the inverting input of the comparator;
and wherein:
the output stage is a power MOSFET having a gate coupled to the output of the operational amplifier, a first terminal configured to couple to a load and a second terminal configured to couple to ground;
the timing circuit is implemented with an RC circuit; and
the operational amplifier is a transconductance amplifier.

11. An apparatus, comprising:
an operational amplifier having an input and an output, the input coupled to receive an input pulse signal;
an output stage having an input coupled to the output of the operational amplifier, a current output configured to couple to a load and a voltage sense output;
a comparator having a non-inverting input coupled to the voltage sense output of the output stage, an inverting input coupled to the input pulse signal and an output; and
a timing circuit having an input coupled to the output of the comparator and an input configured to couple to an input signal and having an output to supply the input pulse signal, the timing circuit to measure a property of the input signal, the timing circuit to replicate the measured property as a property of the input pulse signal.

12. The apparatus of claim 11, wherein:
the timing circuit is to measure a delay from a change in the input signal to a change in the output of the comparator.

13. The apparatus of claim 11, wherein:
the timing circuit is to measure a width of a pulse of the input signal.

14. The apparatus of claim 11, further comprising:
a voltage offset interposed between the voltage sense output of the output stage and the inverting input of the comparator.

15. The apparatus of claim 11, wherein:
the output stage is a power MOSFET having a gate coupled to the output of the operational amplifier, a first terminal configured to couple to a load and a second terminal configured to couple to ground.

16. The apparatus of claim 11, wherein:
the timing circuit is implemented as a means for timing.

17. The apparatus of claim 11, wherein:
The apparatus of claim 1, further comprising:
a voltage offset interposed between the voltage sense output of the output stage and the inverting input of the comparator;
and wherein:
the output stage is a power MOSFET having a gate coupled to the output of the operational amplifier, a first terminal configured to couple to a load and a second terminal configured to couple to ground;
the operational amplifier is a transconductance amplifier; and
the timing circuit is implemented with an RC circuit.

18. A method, comprising:
receiving a pulse leading edge as an input signal;
asserting an output signal responsive to the pulse leading edge;

comparing a change in the output signal to the input signal;
measuring a delay from receipt of the pulse leading edge to assertion of the output signal wherein the measuring occurs responsive to the comparing;
receiving a pulse trailing edge as an input signal;
delaying de-assertion of the output signal for a time approximately equal to the measured delay; and
de-asserting the output signal.

19. A method, comprising:
receiving a pulse leading edge as an input signal;
asserting an output signal responsive to the pulse leading edge;
measuring a delay from receipt of the pulse leading edge to assertion of the output signal through use of an RC timing circuit;
receiving a pulse trailing edge as an input signal;
delaying de-assertion of the output signal for a time approximately equal to the measured delay; and
de-asserting the output signal.

* * * * *